US009029218B2

(12) United States Patent
Loh et al.

(10) Patent No.: US 9,029,218 B2
(45) Date of Patent: May 12, 2015

(54) TUNNELING FIELD-EFFECT TRANSISTOR WITH DIRECT TUNNELING FOR ENHANCED TUNNELING CURRENT

(71) Applicant: Sematech, Inc., Albany, NY (US)

(72) Inventors: Wei-Yip Loh, Austin, TX (US); Brian Coss, Coppell, TX (US); Kanghoon Jeon, Albany, CA (US)

(73) Assignee: Sematech, Inc., Albany, NY (US)

( * ) Notice: Subject to any disclaimer, the term of this patent is extended or adjusted under 35 U.S.C. 154(b) by 27 days.

(21) Appl. No.: 13/856,649

(22) Filed: Apr. 4, 2013

(65) Prior Publication Data

US 2013/0230954 A1    Sep. 5, 2013

Related U.S. Application Data

(62) Division of application No. 12/719,697, filed on Mar. 8, 2010, now Pat. No. 8,436,422.

(51) Int. Cl.
*H01L 21/336*    (2006.01)
*H01L 29/66*     (2006.01)
*H01L 29/78*     (2006.01)

(52) U.S. Cl.
CPC .......... *H01L 29/66477* (2013.01); *H01L 29/78* (2013.01)

(58) Field of Classification Search
CPC .......................... H01L 29/78; H01L 29/66477
USPC .......... 438/268, 286; 257/410, 288, E21.409, 257/E21.255
See application file for complete search history.

(56) References Cited

U.S. PATENT DOCUMENTS

| | | | | |
|---|---|---|---|---|
| 3,935,586 | A | 1/1976 | Landheer et al. | 257/260 |
| 4,835,581 | A | 5/1989 | Kuroda et al. | 257/105 |
| 4,907,053 | A * | 3/1990 | Ohmi | 257/315 |
| 5,217,923 | A | 6/1993 | Suguro | 438/105 |
| 5,365,083 | A | 11/1994 | Tada | 257/105 |
| 6,303,479 | B1 | 10/2001 | Snyder | 438/581 |
| 6,744,103 | B2 | 6/2004 | Snyder | 257/369 |
| 6,784,035 | B2 | 8/2004 | Snyder et al. | 438/167 |
| 7,176,483 | B2 | 2/2007 | Grupp et al. | 257/30 |
| 7,238,567 | B2 | 7/2007 | Xiong | 438/240 |
| 7,294,898 | B2 | 11/2007 | Snyder et al. | 257/453 |
| 2005/0269635 | A1 | 12/2005 | Bojarczuk et al. | 257/338 |
| 2006/0166424 | A1* | 7/2006 | Schaeffer et al. | 438/199 |
| 2008/0050881 | A1 | 2/2008 | Chen et al. | 438/301 |
| 2011/0147838 | A1* | 6/2011 | Gossner et al. | 257/345 |

* cited by examiner

*Primary Examiner* — William F Kraig
*Assistant Examiner* — Nga Doan
(74) *Attorney, Agent, or Firm* — Norton Rose Fulbright US LLP (57) ABSTRACT

Horizontal and vertical tunneling field-effect transistors (TFETs) having an abrupt junction between source and drain regions increases probability of direct tunneling of carriers (e.g., electrons and holes). The increased probability allows a higher achievable on current in TFETs having the abrupt junction. The abrupt junction may be formed by placement of a dielectric layer or a dielectric layer and a semiconductor layer in a current path between the source and drain regions. The dielectric layer may be a low permittivity oxide such as silicon oxide, lanthanum oxide, zirconium oxide, or aluminum oxide.

4 Claims, 13 Drawing Sheets

FIG. 8

TUNNELING FIELD-EFFECT TRANSISTOR WITH DIRECT TUNNELING FOR ENHANCED TUNNELING CURRENT

CROSS-REFERENCE TO RELATED APPLICATIONS

This application is a divisional application of U.S. patent application Ser. No. 12/719,697 to Wei-Yip Loh et al., filed Mar. 8, 2010, and entitled "TUNNELING FIELD-EFFECT TRANSISTOR WITH DIRECT TUNNELING FOR ENHANCED TUNNELING CURRENT," which is hereby incorporated by reference in its entirety.

BACKGROUND OF THE INVENTION

1. Field of the Invention

The present disclosure generally relates to semiconductor devices. More specifically, the present disclosure relates to tunneling field-effect transistors.

2. Description of Related Art

Advances in the semiconductor industry have reduced the size of transistors in integrated circuits (ICs) to 45 nm. Continuing pressure to create smaller and more power efficient products will continue to reduce the transistor size to 32 nm and smaller. Decreasing in transistor sizes leads to decreases in power supply voltage to the transistors and capacitance of the transistors. For example, power supply voltages have decreased from 5 Volts to nearly 1 Volt in the last fifteen years. As the power supply voltage has decreased, the threshold voltage of the transistors in the ICs has also decreased.

Lower threshold voltages are difficult to obtain in conventional metal-oxide-semiconductor field-effect transistors (MOSFETs) because as the threshold voltage is reduced the ratio of on current to off current ($I_{on}/I_{off}$) also decreases. The on current refers to the current through a MOSFET when a gate voltage applied is above the threshold voltage, and the off current refers to current through a MOSFET when a gate voltage applied is below the threshold voltage.

Figure 1A:
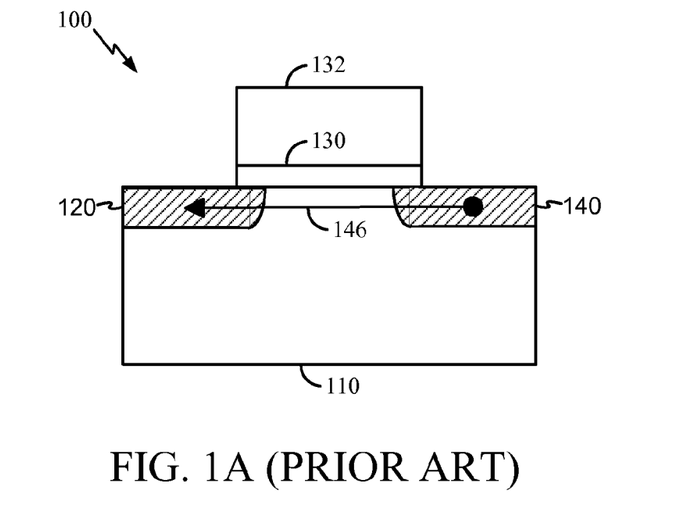
FIG. 1A is a cross-sectional view illustrating a conventional tunneling field-effect transistor.

Tunneling field-effect transistors (TFETs) as shown in FIG. 1A have improved on current to off current ($I_{on}/I_{off}$) ratios. Band-to-band tunneling in TFETs increases the achievable on current ($I_{on}$) allowing further reductions in threshold voltage, power supply voltage, and transistor size. A conventional TFET 100 includes a drain region 120 and a source region 140 in a substrate layer 110. The drain region 120 and the source region 140 are doped with opposite carriers. For example, the drain region 120 may be an n-doped region and the source region 140 may be a p-doped region. A gate oxide 130 is deposited on the substrate layer 110, and a gate electrode 132 is deposited on the gate oxide 130. A gate voltage above the threshold voltage applied to the gate electrode 132 switches the TFET 100 from an off state to an on state. During the on state current conducts substantially along a path illustrated by a line 146 from the source region 140 through the substrate layer 110 to the drain region 120.

Figure 1B:
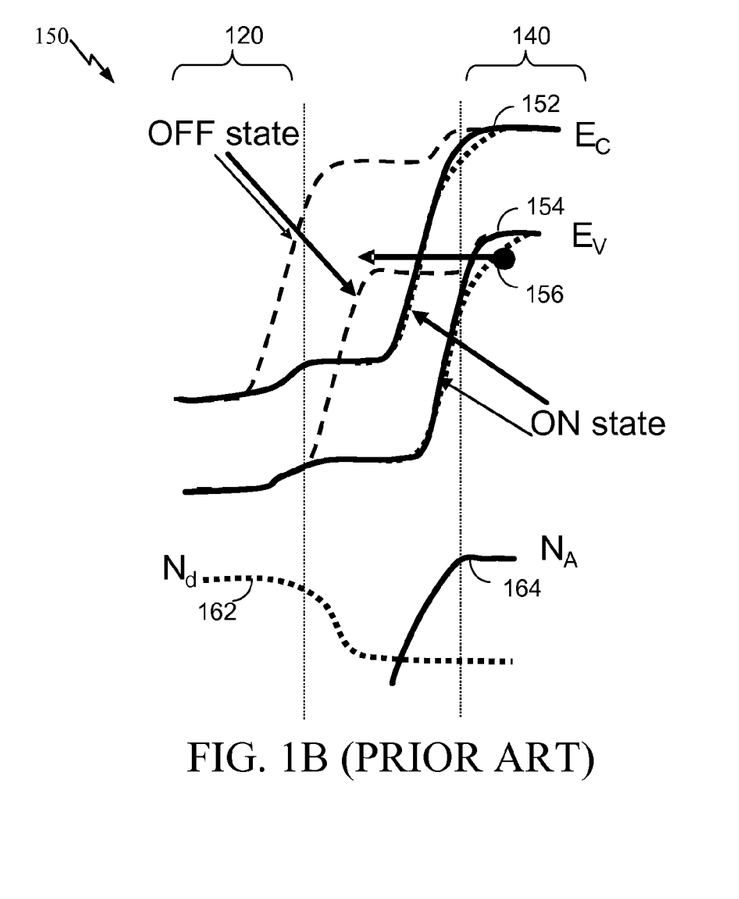
FIG. 1B is a graph illustrating a band diagram for a conventional tunneling field-effect transistor.

A band diagram 150 for the TFET 100 is shown in FIG. 1B. A line 152 represents energy levels of the conduction band, and a line 154 represents energy levels of the valence band. A shift in the lines 152, 154 occurs due to different carrier dopings in the regions 120, 140. A line 164 represents the doping concentration profile for carriers implanted in the source region 140, and a line 162 represents the doping concentration profile for carriers implanted in the drain region 120. Overlap of the doping concentration profile is indicated by the lines 162, 164 between the regions 120, 140. In an on state of the TFET 100, a carrier 156 (e.g., electron or hole) traverses from the source region 140 to the drain region 120.

However, on current ($I_{on}$) in conventional TFETs, such as TFET 100 in FIG. 1A, is limited by band-to-band tunneling (BT-BT). The solid solubility and large bandgap of, for example, silicon limits BT-BT. The tunneling probability is also adversely affected by the concentration profile of region 140 under gate bias. Depletion of carrier in region 140 during ON gate bias will lead to a less abrupt concentration profile thus reducing the tunneling current.

SUMMARY OF THE INVENTION

According to one aspect of the disclosure, a semiconductor device includes a semiconductor layer. The semiconductor device also includes a first doped region in the semiconductor layer. The semiconductor device further includes a dielectric layer on the first doped region. The semiconductor device also includes a second doped region in the semiconductor layer, in which the first doped region and the second doped region are asymmetric. The semiconductor device further includes a gate stack on the semiconductor layer partially covering the first doped region and partially covering the second doped region.

According to another aspect of the disclosure, a semiconductor device includes a first semiconductor layer. The semiconductor device also includes a doped region in the first semiconductor layer. The semiconductor device further includes a gate stack on the first semiconductor layer including a first sidewall and a second sidewall. The second sidewall partially covers the doped region. The semiconductor device also includes a second semiconductor layer on the first sidewall. The semiconductor device further includes a dielectric layer on the second semiconductor layer. The semiconductor device also includes a third semiconductor layer on the dielectric layer.

According to yet another aspect of the disclosure, a process for manufacturing a semiconductor device includes forming a first doped region in a first semiconductor layer. The process also includes depositing a dielectric layer on the first doped region. The process further includes depositing a second semiconductor layer on the dielectric layer. The process also includes etching the second semiconductor layer, the dielectric layer, and the first doped region from a first region. The process further includes depositing a third semiconductor layer on the first semiconductor layer in the first region. The process also includes forming a gate stack on the first semiconductor layer partially covering the third semiconductor layer and the second semiconductor layer. The process also includes forming spacers on the gate stack. The process further includes forming a second doped region in the third semiconductor layer.

According to a further aspect of the disclosure, a process for manufacturing a semiconductor device includes forming a gate stack on a first semiconductor layer. The process also includes forming sidewalls on the gate stack. The process further includes depositing a sacrificial layer on a first side of the gate stack. The process also includes forming a doped region in the first semiconductor layer partially covered by the sacrificial layer. The process further includes depositing a second semiconductor layer on a second side of the gate stack, the second side different from the first side. The process also includes depositing a dielectric layer on the second semiconductor layer. The process further includes depositing a third semiconductor layer on the dielectric layer. The process also includes stripping the sacrificial layer after depositing the third semiconductor layer.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

The term "coupled" is defined as connected, although not necessarily directly, and not necessarily mechanically.

The terms "a" and "an" are defined as one or more unless this disclosure explicitly requires otherwise.

The term "substantially" and its variations are defined as being largely but not necessarily wholly what is specified as understood by one of ordinary skill in the art, and in one non-limiting embodiment "substantially" refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

For a more complete understanding of the present disclosure, reference is now made to the following description taken in conjunction with the accompanying drawings.

DETAILED DESCRIPTION

Various features and advantageous details are explained more fully with reference to the non-limiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only, and not by way of limitation. Various substitutions, modifications, additions, and/or rearrangements within the spirit and/or scope of the underlying inventive concept will become apparent to those skilled in the art from this disclosure.

Tunneling current in a tunneling field-effect transistor (TFET) may be increased by forming a dielectric layer at the interface of the source or drain region. The dielectric layer creates an abrupt junction between dopants in the semiconductor and enhances the electric field across the p-n junction in the TFET. The enhanced electric field allows direct tunneling (DT) of carriers and creates a higher tunneling probability for carriers in the TFET. Thus, higher on currents ($I_{on}$) and on current to off current ratios ($I_{on}/I_{off}$) are achievable. Exemplary TFETs with a dielectric layer may be embodied in, for example, a horizontal TFET as described in the first embodiment and/or a vertical TFET as described in the second embodiment. An additional semiconductor layer may be deposited on the dielectric layer to further enhance DT.

Figure 2A:
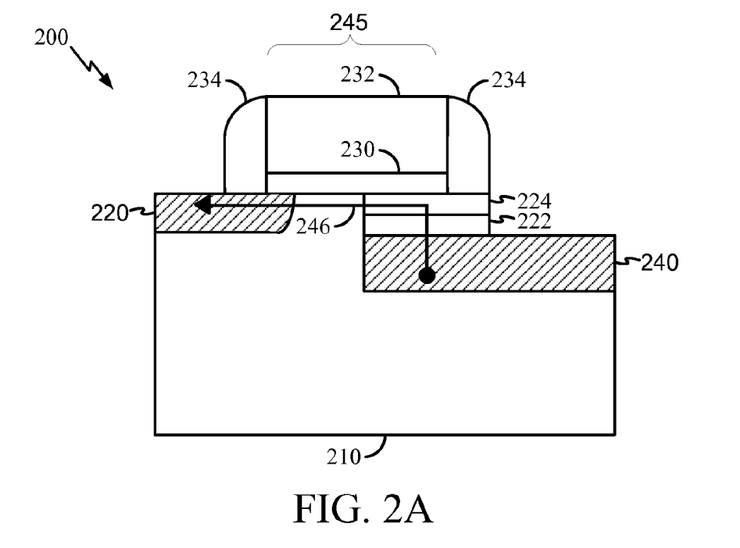
FIG. 2A is a cross-sectional view illustrating an exemplary tunneling field-effect transistor according to a first embodiment.

A cross-sectional view of an exemplary TFET 200 according to a first embodiment is shown in FIG. 2A. The TFET 200 is a horizontal TFET. A semiconductor layer 210 includes a drain region 220 and a source region 240. The semiconductor layer 210 may be, for example, silicon, germanium, or III-V compound semiconductors. The regions 220, 240 are asymmetric. That is, the regions 220, 240 are doped with opposite carriers. For example, the drain region 220 may be n-doped with arsenic, and the source region 240 may be p-doped with boron. During an on state, current conducts substantially along a path illustrated by a line 246. According to one embodiment, the regions 220, 240 may be heavily doped with a concentration of between $1\times10^{-19}$ and $1\times10^{-21}$ atoms/cm$^3$. A gate stack 245 including a gate oxide 230 and a gate electrode 232 are on the semiconductor layer 210 and partially covering the regions 220, 240. The gate oxide 230 may be, for example, high-K dielectrics, silicon oxide, hafnium silicon oxynitride (HfSiON), or other oxides, and the gate electrode 232 may be, for example, a metal or poly-silicon. Spacers 234 are deposited on the sides of the gate stack 245. The spacers 234 may be, for example, silicon oxide, silicon nitride, high-K dielectrics, or other insulating materials.

A dielectric layer 222 is on the source region 240 and may be, for example, silicon oxide, silicon nitride, zirconium oxide, lanthanum oxide, aluminum oxide, or another dielectric material. According to one embodiment, the dielectric layer 222 is a dielectric with low permittivity and has a thickness between 5 and 50 Angstroms. A low permittivity compared with the permittivity of silicon (approx. 11.9) creates a large field drop across the dielectric layer 222 and enhances band alignment. A semiconductor layer 224 is on the dielectric layer 222 and doped with an opposite carrier of the source region 240. The semiconductor layer 224 may be, for example, a poly-silicon layer or epitaxially grown silicon with thickness between 5 and 30 Angstroms. According to one embodiment, the drain region 220 may be n-doped and the semiconductor layer 224 may be p-doped. The dielectric layer 222 and the semiconductor layer 224 create an abrupt junction in the doping profile of the TFET 200. The abrupt junction enhances electric field, allows direct tunneling, and creates a higher tunneling probability for carriers (e.g., holes and electrons). According to some embodiments, the semiconductor layer 224 may be absent, such that the dielectric layer 222 creates an abrupt junction without the semiconductor layer 224.

Figure 2B:
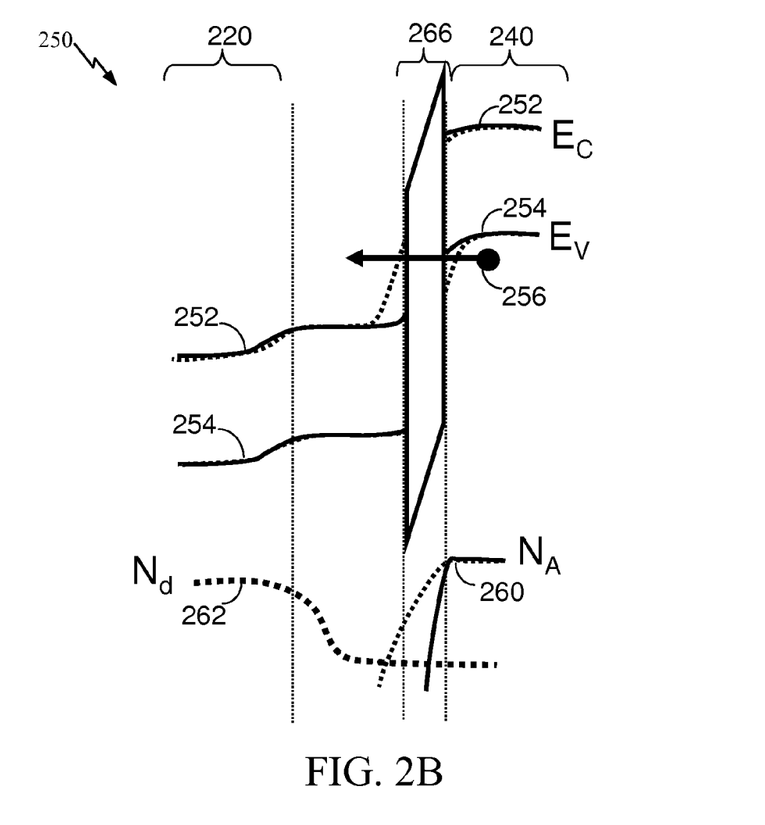
FIG. 2B is a graph illustrating a band diagram for an exemplary tunneling field-effect transistor according to the first embodiment.

FIG. 2B is a graph illustrating band levels and doping levels in the exemplary TFET according to the first embodiment. A line 252 represents the energy levels of the conduction band, and a line 254 represents the energy levels of the valence band. A carrier 256 (e.g., an electron) in the source region 240 tunneling to the drain region 220 has a lower energy barrier to overcome as a result of an abrupt region 266 in the doping profile. Thus, higher tunneling currents are achieved in the TFET 200. The abrupt region 266 minimizes overlap between a doping profile 260 of the source region 240 and a doping profile 262 of the drain region 220 and improves electrostatics of the source region 240 to a channel region or the semiconductor layer 224.

Figure 3A:
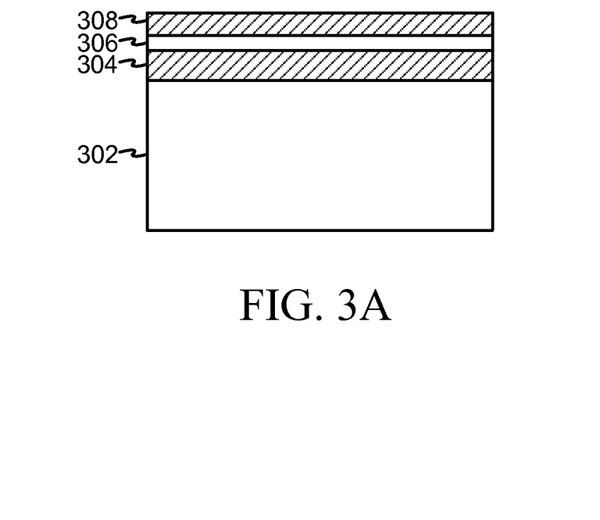
FIGS. 3A-3G are cross-sectional views illustrating a process for manufacturing the exemplary tunneling field-effect transistor according to the first embodiment.
Figure 3B:
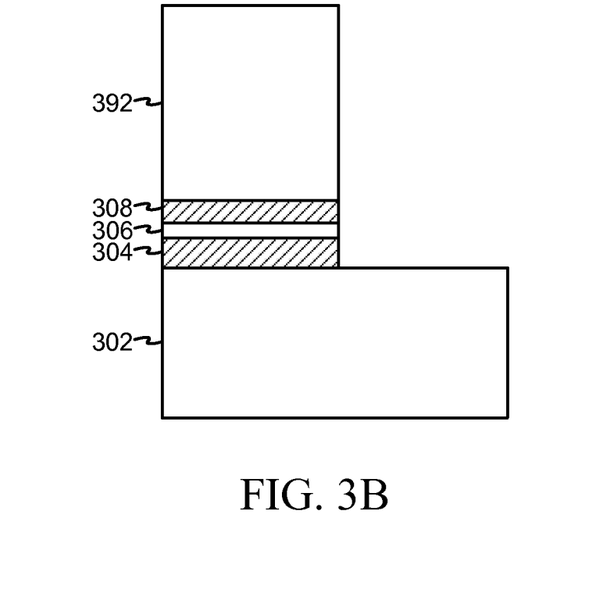
Figure 3C:
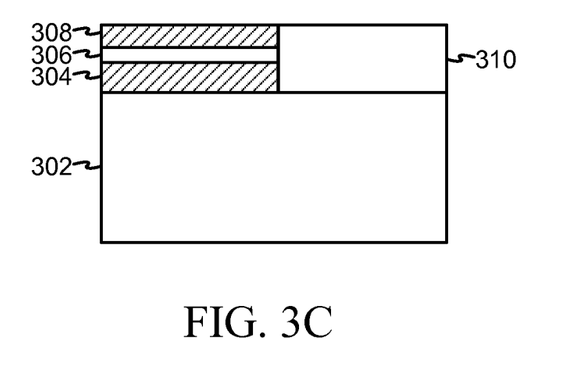
Figure 3D:
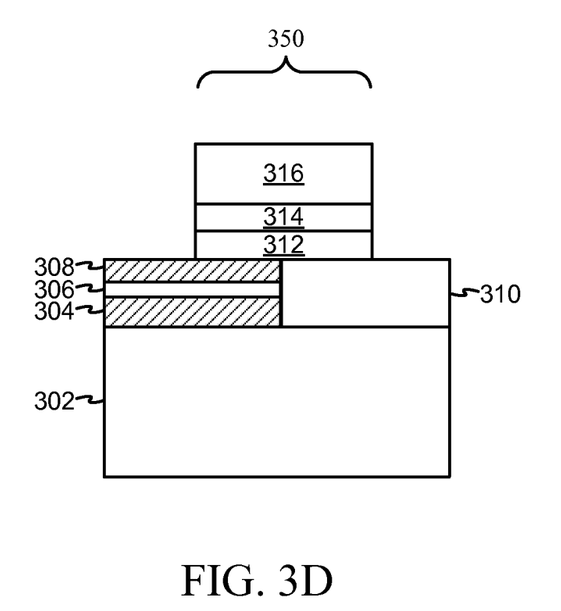
Figure 3E:
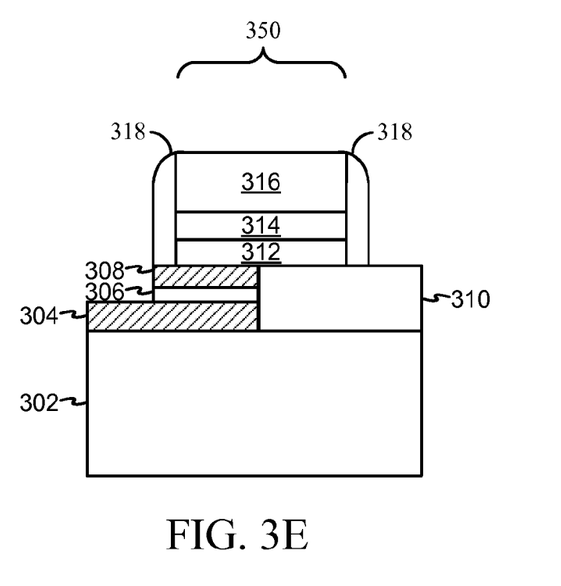
Figure 3F:
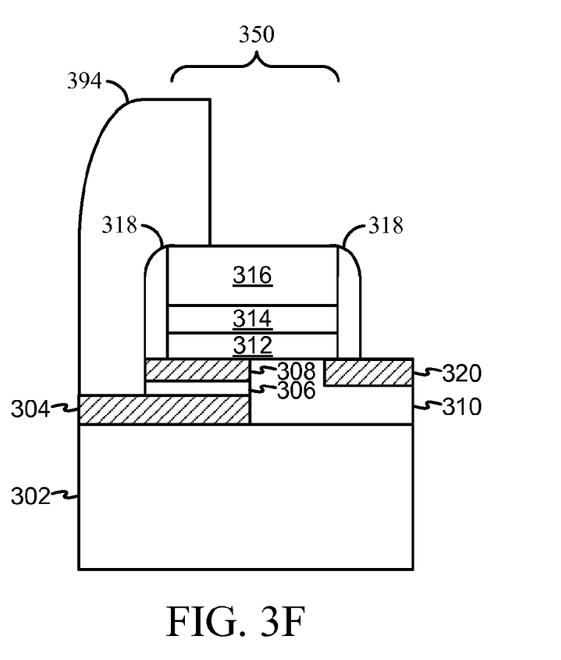
Figure 3G:
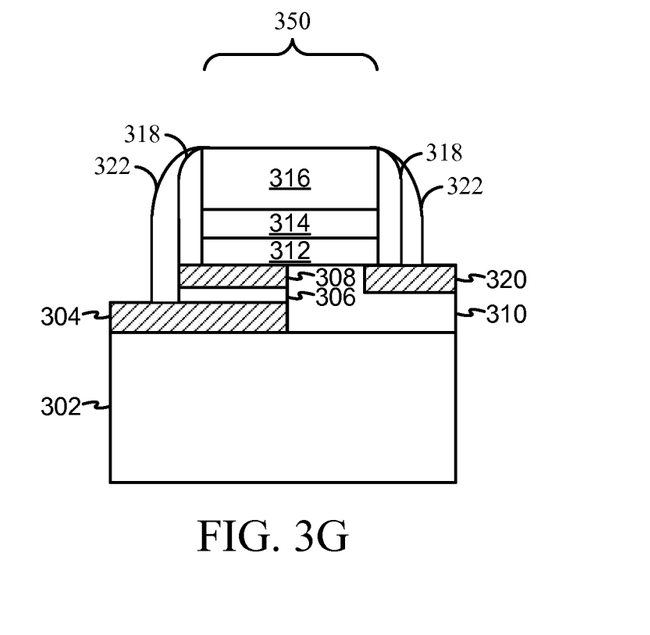
Figure 4:
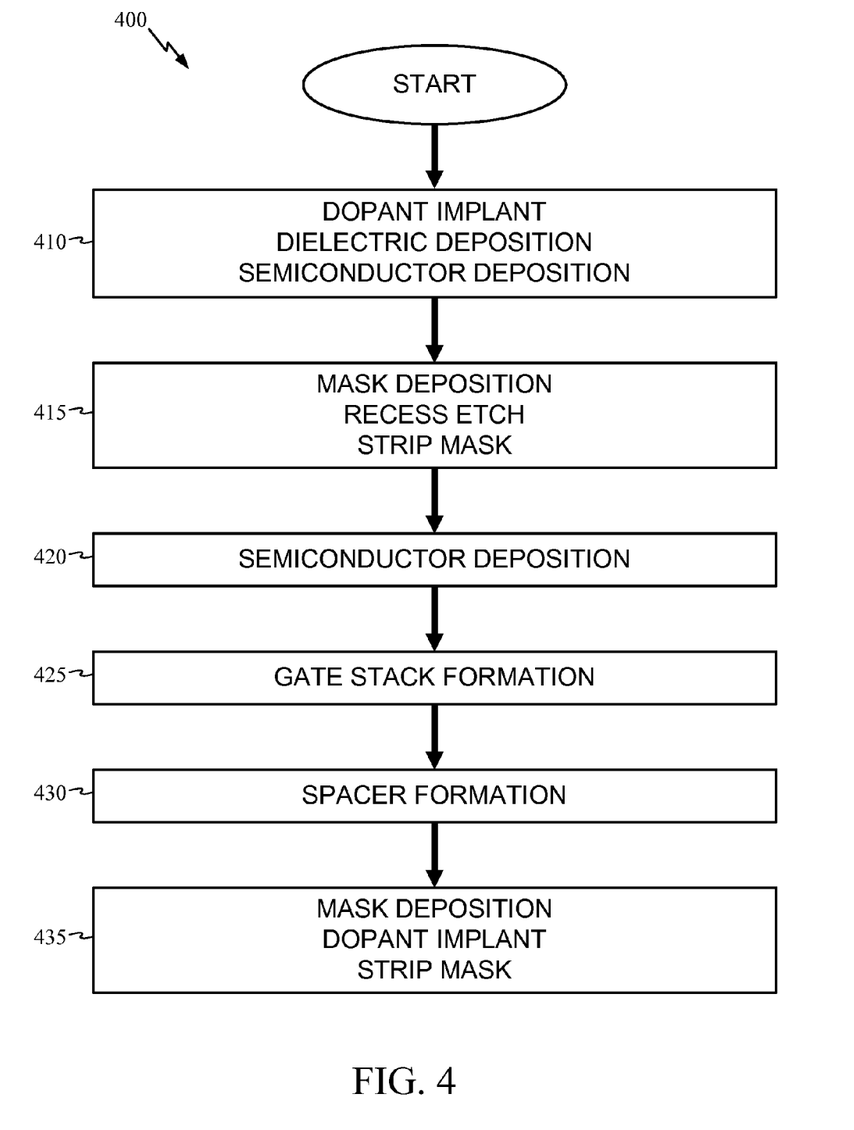
FIG. 4 is a flow chart illustrating an exemplary manufacturing process for a tunneling field-effect transistor according to the first embodiment.

One process for manufacturing an exemplary TFET according to the first embodiment is illustrated in the cross-sectional views of FIGS. 3A-3G and the flow chart of FIG. 4. A flow chart 400 starts at block 410 with dopant implant, dielectric deposition, and semiconductor deposition. Turning to FIG. 3A, a cross-sectional view illustrating a partially complete TFET according to the first embodiment is shown. A semiconductor layer 302 such as, for example, silicon is implanted to create a doped region 304. According to one embodiment, the doped region 304 may be n+ doped with arsenic. A dielectric layer 306 and a semiconductor layer 308 are deposited on the doped region 304. According to one embodiment, the semiconductor layer 308 and the semiconductor layer 302 may be similar materials, and the semiconductor layer 308 may be doped with opposite carriers of the doped region 304. For example, the semiconductor layers 302, 308 may be silicon, and the semiconductor layer 308 may be p-doped. In another example, the semiconductor layers 302, 308 may be a III-V compound semiconductor such as, for example, gallium arsenide (GaAs). The dielectric layer 306 may be, for example, silicon oxide or silicon nitride, aluminum oxide, lanthanum oxide, or zirconium oxide. The dielectric layer 306 and the semiconductor layer 308 increase the tunneling current of a TFET by enhancing band alignment and allowing direct tunneling. According to one embodiment, a semiconductor layer 308 may not be deposited on the dielectric layer 306, and the dielectric layer 306 alone enhances band alignment.

The flow chart 400 continues to block 415 with mask deposition, recess etching, and mask stripping. Turning now to FIG. 3B, a cross-sectional view of a partially complete TFET after recess etch according to the first embodiment is shown. A sacrificial layer 392 is deposited on the semiconductor layer 308 and patterned. According to one embodiment, the sacrificial layer 392 may be a photoresist material and patterned by exposing the sacrificial layer 392 to a light source through a mask and developing the sacrificial layer 392. The sacrificial layer 392 acts as a hard mask for recess etching of the semiconductor layer 308, the dielectric layer 306, and the doped region 304. After recess etching the sacrificial layer 392 is stripped.

The flow chart 400 continues to block 420 with semiconductor deposition. Referring now to FIG. 3C, a cross-sectional view of a partially complete TFET after semiconductor deposition according to the first embodiment is shown. A semiconductor layer 310 is deposited. The semiconductor layer 310 may be deposited, for example, through selective epitaxy. According to one embodiment, the semiconductor layer 310 may be silicon.

The flow chart 400 continues to block 425 with gate stack formation. Turning now to FIG. 3D, a cross-sectional view illustrating a partially complete TFET after gate stack formation according to the first embodiment is shown. A gate oxide 312 is deposited, followed by a gate electrode 314, and a gate electrode 316. The gate oxide 312 may be, for example, high-K dielectrics, silicon oxide, or other oxides. The gate electrode 314 and the gate electrode 316 may be, for example, tantalum nitride and poly-silicon, respectively. The gate oxide 312, the gate electrode 314, and the gate electrode 316 are patterned into a gate stack 350.

The flow chart 400 continues to block 430 with spacer formation. Referring now to FIG. 3E, a cross-sectional view illustrating a partially complete TFET after spacer deposition and etch back according to the first embodiment is shown. Spacers 318 are deposited and etched back to substantially cover sides of the gate stack 350.

The flow chart 400 continues to block 435 with mask deposition, dopant implant, and mask stripping. Turning now to FIG. 3F, a cross-sectional view illustrating a partially complete TFET after doping a second region according to the first embodiment is shown. A sacrificial layer 394 is deposited and patterned to cover substantially all of the doped region 304. The sacrificial layer 394 may be, for example, tetraethyl orthosilicate (TEOS) or a photoresist material. A doped region 320 is formed by implant of opposite carriers than used in the doped region 304. According to one embodiment, the doped region 320 may be p+ doped with, for example, boron. The sacrificial layer 394 is stripped after the doped region 320 is formed.

In some embodiments, additional layers are deposited on the TFET. For example, in one embodiment, a second spacer is deposited. FIG. 3G is a cross-sectional view illustrating a partially complete TFET after depositing a second spacer according to the first embodiment. Spacers 322 are deposited and etched back to substantially surround the spacers 318. According to another embodiment, silicide layers (not shown) may be deposited on the doped regions 304, 320. Additionally, according to another embodiment, contacts (not shown) may be deposited to couple the doped regions 304, 320 or silicide layers (not shown) to other components.

Figure 5:
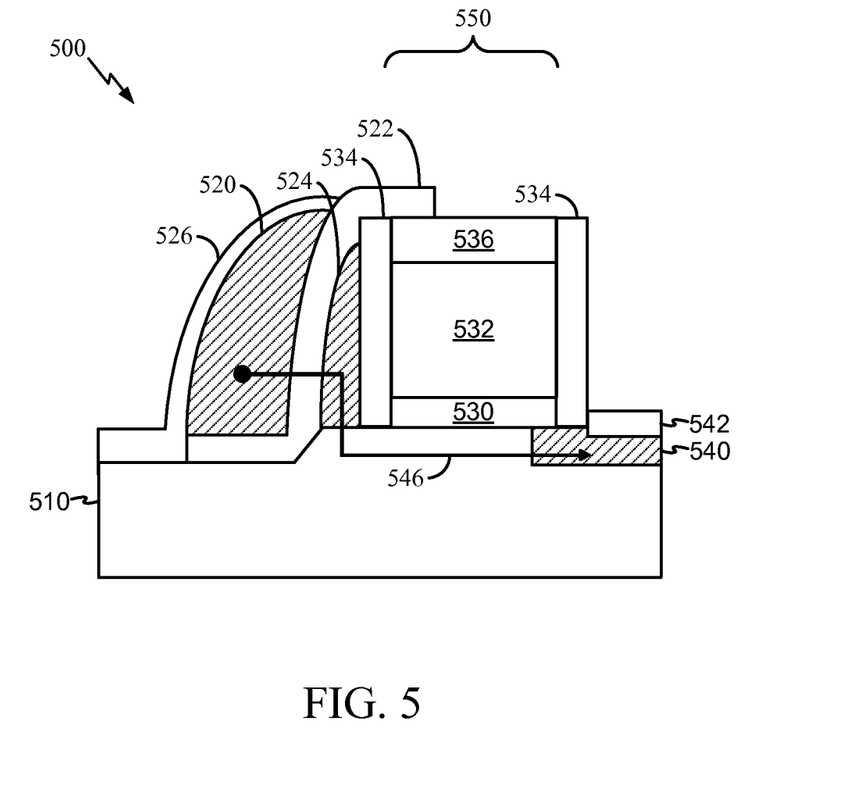
FIG. 5 is a cross-sectional view illustrating an exemplary tunneling field-effect transistor according to a second embodiment.

A cross-sectional view of an exemplary TFET according to a second embodiment is illustrated in FIG. 5. A TFET 500 includes a source region 520 and a drain region 540 in a semiconductor layer 510. The source region 520 may be a semiconductor layer such as, for example, poly-silicon. The TFET 500 is a vertical TFET and includes an asymmetric source/drain. For example, the source region 520 may be p-doped, and the drain region 540 may be n-doped. Silicide layer 526, 542 such as, for example, nickel silicide, may be formed on the regions 520, 540, respectively. A gate oxide 530, a gate electrode 532, and a gate electrode 536 are on the semiconductor layer 510 in a gate stack 550 partially covering the drain region 540. According to one embodiment, the gate oxide 530 may be a high-K dielectric, HfSiON, hafnium oxide, silicon oxide, or other dielectric materials. The gate electrodes 532, 536 may be, for example, poly-silicon and silicon nitride, respectively.

Spacers 534 on sides of the gate stack 550 may be, for example, a high-K dielectric or silicon oxide. A dielectric layer 522 separates the source region 520 and a semiconductor layer 524. The dielectric layer 522 may be, for example, a high-K dielectric, aluminum oxide, lanthanum oxide, zirconium oxide, or other dielectric material. The gate oxide 530 thickness may be, for example, between 5 and 50 Angstroms. According to one embodiment, the gate oxide 530 thickness may be less than ten Angstroms. The semiconductor layer 524 is doped with opposite carriers of the source region 520 and may be 5 to 15 nanometers in thickness. For example, if the source region 520 is p-doped the semiconductor layer 524 is n-doped. During an on state of the TFET 500, current conducts substantially along a path indicated by a line 546. That is, current flows from the source region 520, through the dielectric layer 522, through the semiconductor layer 524, through the semiconductor layer 510, and to the drain region 540. The current may be extracted through contacts (not shown) to the silicide layer 542 and the silicide layer 526.

Figure 6A:
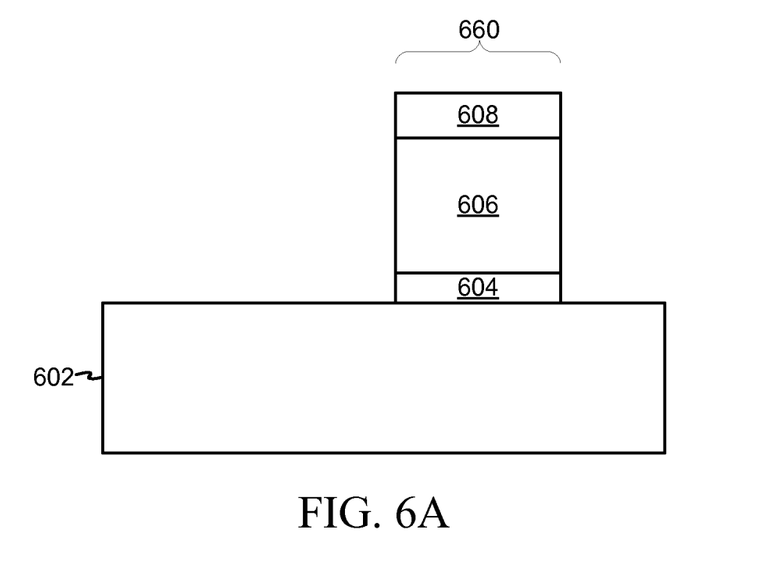
FIGS. 6A-6E are cross-sectional views illustrating a process for manufacturing the exemplary tunneling field-effect transistor according to the second embodiment.
Figure 6B:
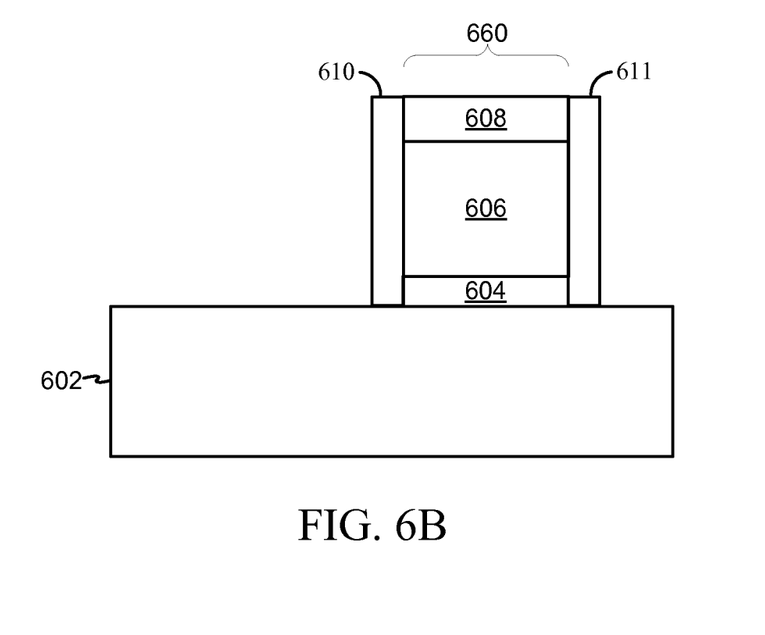
Figure 6C:
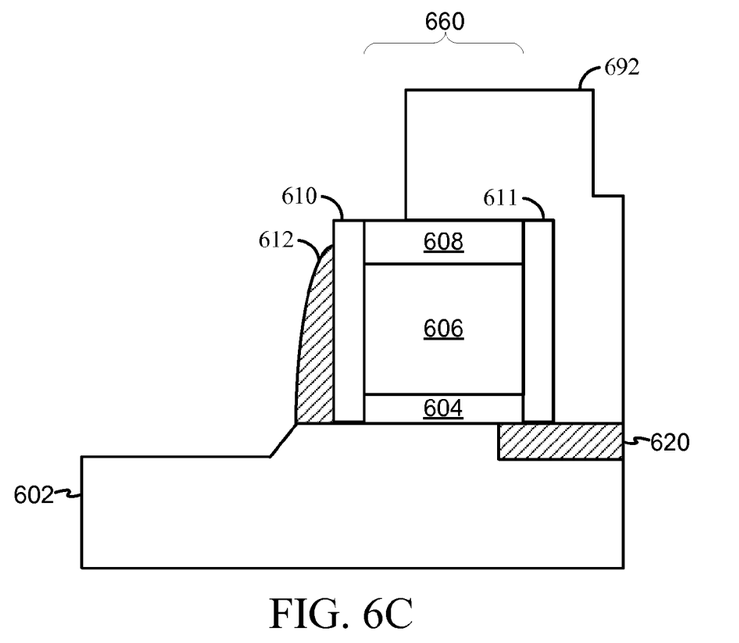
Figure 6D:
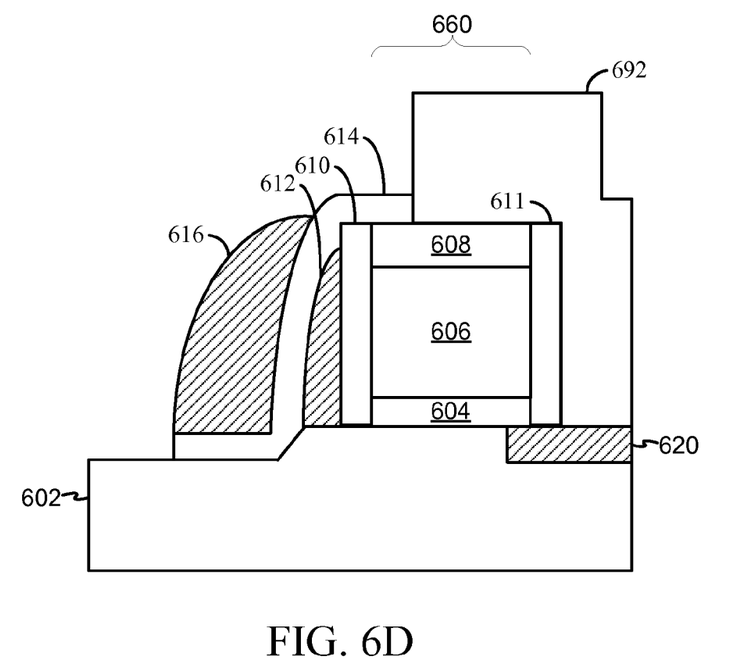
Figure 6E:
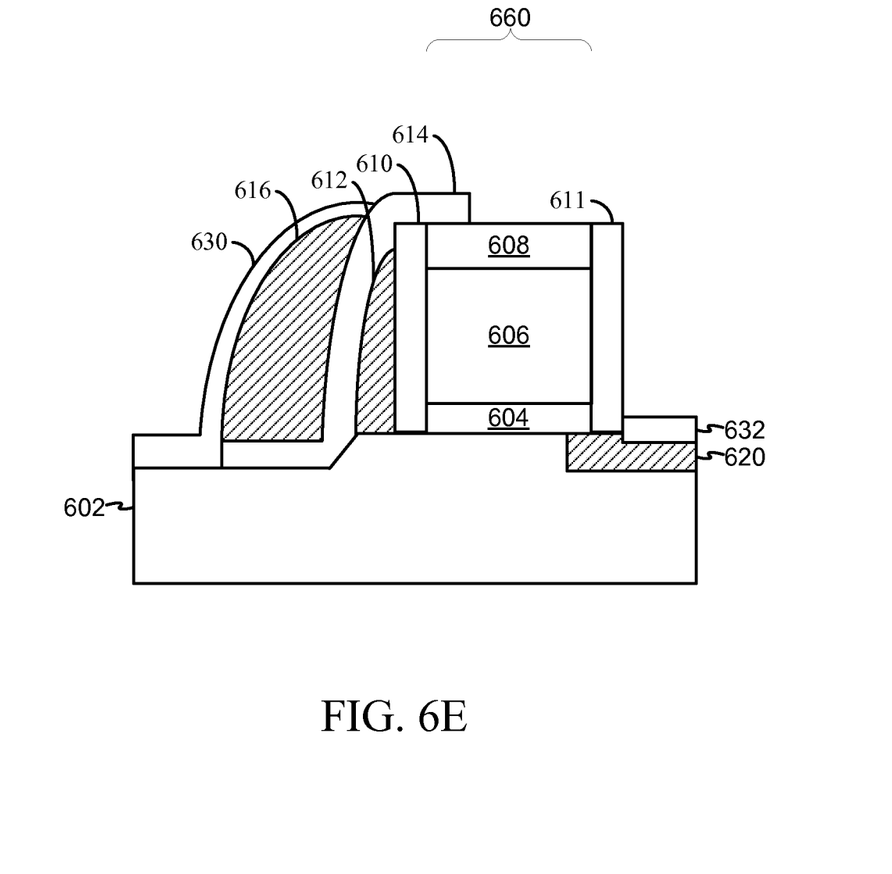
Figure 7:
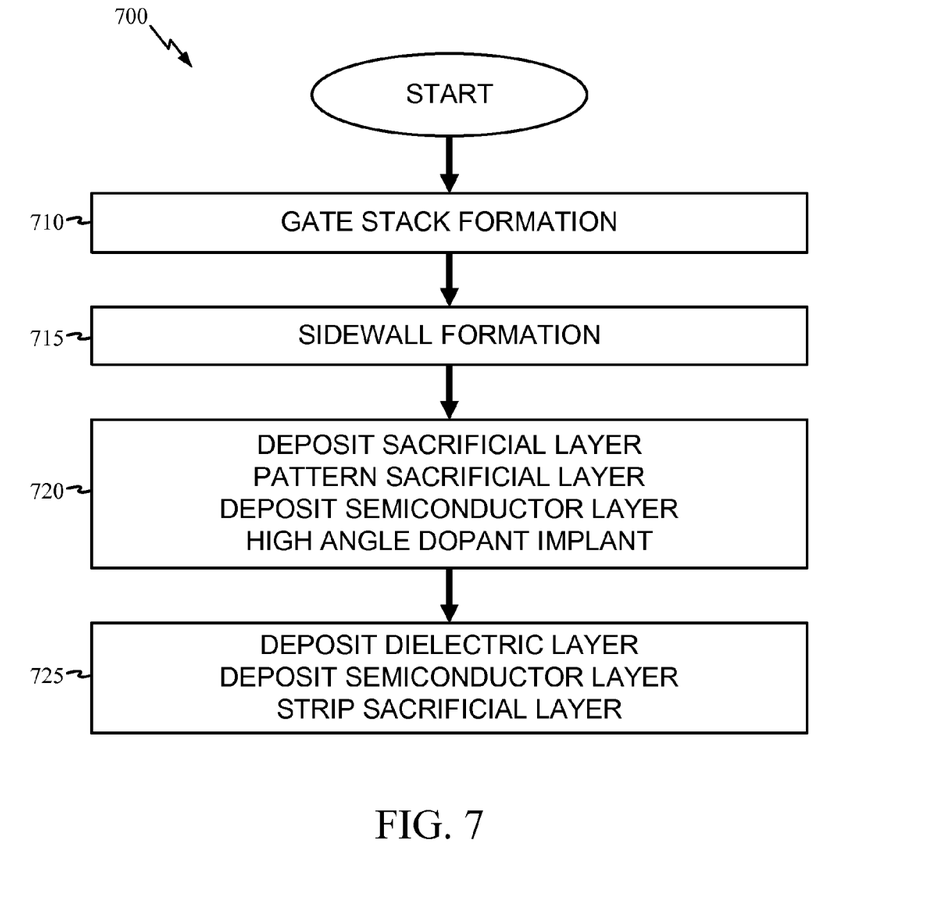
FIG. 7 is a flow chart illustrating an exemplary manufacturing process for a tunneling field-effect transistor according to the second embodiment.

One process for manufacturing an exemplary TFET according to the second embodiment is illustrated in the cross-sectional views of FIGS. 6A-6E and the flow chart of FIG. 7. A flow chart 700 starts at block 710 with gate stack formation. Turning now to FIG. 6A, a cross-sectional view illustrating a partially complete TFET according to the second embodiment is shown. A gate stack 660 is formed on a semiconductor layer 602 by depositing a gate dielectric 604, a gate electrode 606, and a gate electrode 608. The gate dielectric 604, the gate electrode 606, and the gate electrode 608 are patterned through wet or plasma etching into the gate stack 660. The gate dielectric 604 may be, for example, a high-K dielectric, HfSiON, hafnium oxide, silicon oxide, or other dielectric materials. According to one embodiment, the gate electrode 606 may be poly-silicon, and the gate electrode 608 may be tantalum nitride. According to another embodiment, the gate electrode 606 may be a metal.

The flow chart 700 continues to block 715 with sidewall formation. Referring now to FIG. 6B, a cross-sectional view illustrating a partially complete TFET after sidewall formation according to the second embodiment is shown. After the gate stack 660 is formed, sidewalls 610, 611 are deposited on the gate stack 660. According to one embodiment the sidewalls 610, 611 are formed by oxidizing the gate stack 660. According to another embodiment, the sidewalls 610, 611 are formed by depositing a dielectric layer and plasma etching the dielectric layer to confine the dielectric layer to the sidewalls 610, 611 of the gate stack 660.

The flow chart 700 continues to block 720 with depositing and patterning a sacrificial layer, depositing semiconductor material, and high angle dopant implanting. Turning now to FIG. 6C, a cross-sectional view illustrating a partially complete TFET according to the second embodiment is shown. A sacrificial layer 692 is deposited and patterned to substantially cover the sidewall 611. The sacrificial layer 692 may be, for example, a photoresist or an oxide such as TEOS. A semiconductor layer 612, such as poly-silicon or any polycrystalling semiconductor material including but not limited to germanium, silicon germanide, or any other group IV and group III-V elements, is deposited on the sidewall 610. According to one embodiment, the semiconductor layer 612 may be epitaxially grown and of five to fifteen nanometers in thickness and doped n+ with arsenic atoms. During etch back of the semiconductor layer 612, the semiconductor layer 602 is also etched in regions not masked by the sacrificial layer 692. A doped region 620 in the semiconductor layer 602 may be formed through implantation prior to deposition of the sacrificial layer 692 or after stripping the sacrificial layer 692. According to one embodiment, the doped region 620 is n+ doped with arsenic atoms.

The flow chart 700 continues to block 725 with dielectric layer deposition and semiconductor layer deposition. Referring now to FIG. 6D, a cross-sectional view illustrating a partially complete TFET after deposition of dielectric and semiconductor layers according to the second embodiment is shown. A dielectric layer 614 is deposited on the semiconductor layer 612. According to one embodiment, the dielectric layer 614 may be a high-K dielectric, hafnium oxide, silicon oxide, or other dielectric material. A semiconductor layer 616 is deposited on the dielectric layer 614. The semiconductor layer 616 may be, for example, poly-silicon and doped with opposite carriers of the doped region 620. According to one embodiment, the semiconductor layer 616 may be p+ doped with boron. The sacrificial layer 692 is stripped after deposition of the semiconductor layer 616.

In some embodiments, additional processes may be performed. For example, silicide layers may be formed on the source and drain regions. Turning now to FIG. 6E, a cross-sectional view illustrating a partially complete TFET after silicidation according to the second embodiment is shown. A silicide layer 630 and a silicide layer 632 are formed on the semiconductor layer 616 and the doped region 620, respectively. Additionally, the silicide layer 630 may include a region of the semiconductor layer 602. In an additional embodiment, contacts (not shown) may be formed to couple the silicide layers 630, 632 to other devices.

A dielectric layer placed between the source and drain of a tunneling field-effect transistor (TFET) forms an abrupt doping profile, which enhances the tunneling probability and tunneling current in the TFET. The enhanced tunneling probability results from direct tunneling between the source and drain regions. A doped semiconductor layer may also be placed between the source and drain regions to further enhance the tunneling probability and tunneling current. Both horizontal TFETs and vertical TFETs may be constructed with the additional dielectric layer or the additional dielectric layer and semiconductor layer.

The semiconductor structures, such as a TFET, disclosed above may be employed in integrated circuits. For example, the TFET may be part of a NAND or NOR gate in a logic device such as a microprocessor. Alternatively, the TFET may be integrated into a memory device.

Figure 8:
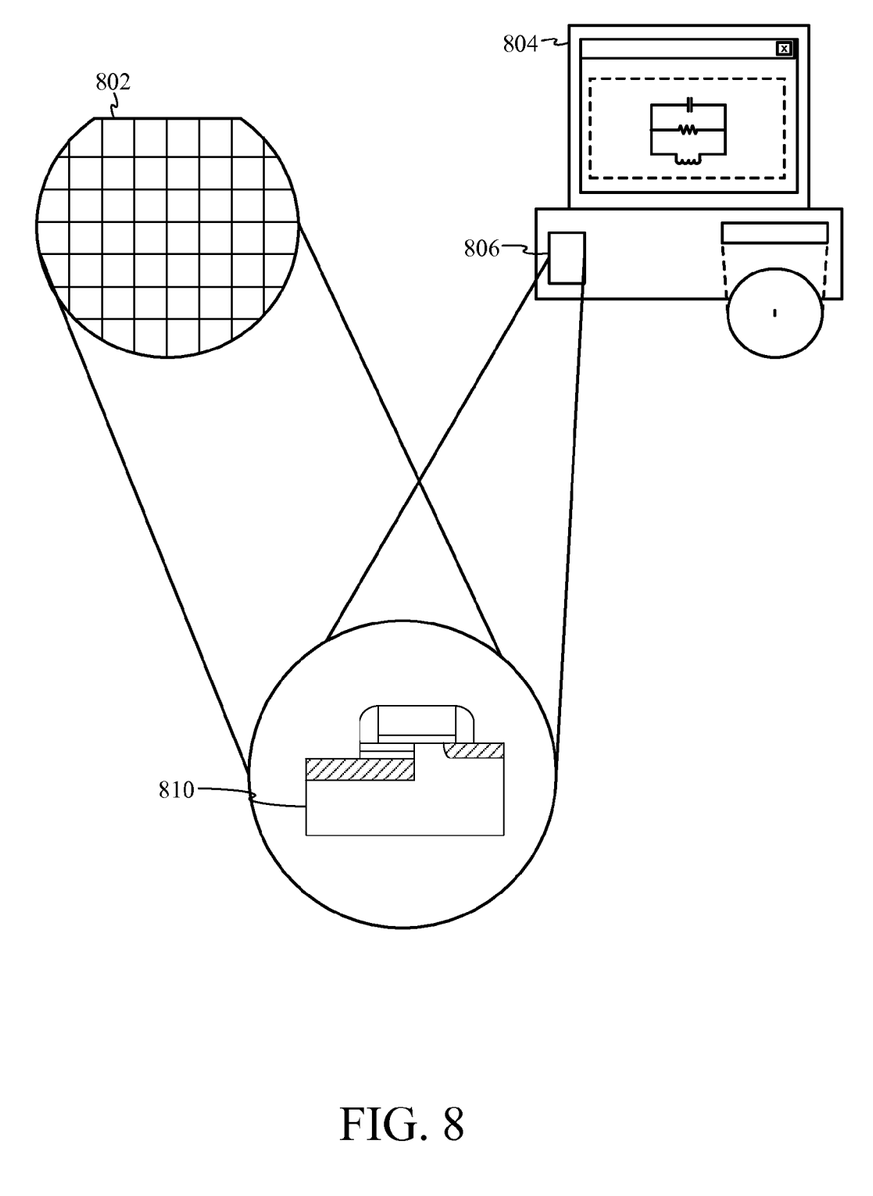
FIG. 8 is a block diagram illustrating implementation of a circuit in a semiconductor wafer or an electronic device according to one embodiment.

FIG. 8 is a block diagram illustrating implementation of a circuit in a semiconductor wafer or an electronic device according to one embodiment. In one case, a TFET 810 with enhanced tunneling current as discussed above may be found in a wafer 802. The wafer 802 may be singulated into one or more dies that may contain the TFET 810. Additionally, the wafer 802 may experience further semiconductor manufacturing before singulation. For example, the wafer 802 may be bonded to a carrier wafer, a packaging bulk region, a second wafer, or transferred to another fabrication facility. Alternatively, an electronic device 804 such as, for example, a personal computer may include a memory device 806 that includes the TFET 810. Additionally, other parts of the electronic device 804 may include the TFET 810 such as a central processing unit (CPU), a digital-to-analog converter (DAC), an analog-to-digital converter (ADC), a graphics processing unit (GPU), a microcontroller, or a communications controller.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A process for manufacturing a semiconductor device, comprising:
    forming a first doped region in a first semiconductor layer;
    depositing a dielectric layer on the first doped region;
    depositing a second semiconductor layer on the dielectric layer;
    etching the second semiconductor layer, the dielectric layer, and the first doped region to form a first region comprising a path for current through the semiconductor device to flow to the first doped region through the dielectric layer;
    depositing a third semiconductor layer on the first semiconductor layer in the first region;
    forming a gate stack on the first semiconductor layer partially covering the third semiconductor layer and the second semiconductor layer;
    forming spacers on the gate stack; and
    forming a second doped region in the third semiconductor layer, wherein the current path flows from the second doped region to the first doped region through the dielectric layer.

2. The process of claim 1, further comprising forming second spacers on the gate stack after forming the spacers on the gate stack.

3. The process of claim 1, further comprising forming a first silicide layer in the first doped region and a second silicide layer in the second doped region.

4. The process of claim 1, further comprising forming contacts coupled to the first doped region and the second doped region.

* * * * *